United States Patent
Yoon et al.

(10) Patent No.: US 8,405,158 B2
(45) Date of Patent: Mar. 26, 2013

(54) SEMICONDUCTOR DEVICES AND METHODS OF FABRICATING THE SAME

(75) Inventors: Young-Bae Yoon, Yongin-si (KR); Jong-Hyuk Kim, Osan-si (KR); Keonsoo Kim, Hwaseong-si (KR); Youngseop Rah, Yongin-si (KR); Yoonmoon Park, Seoul (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 445 days.

(21) Appl. No.: 12/832,373

(22) Filed: Jul. 8, 2010

(65) Prior Publication Data

US 2011/0038211 A1    Feb. 17, 2011

(30) Foreign Application Priority Data

Aug. 14, 2009   (KR) .................. 10-2009-0075278

(51) Int. Cl.
*H01L 27/088* (2006.01)
*H01L 29/76* (2006.01)

(52) U.S. Cl. ...... 257/392; 257/314; 257/506; 257/E29.3; 257/E27.06

(58) Field of Classification Search ............. 365/185.17; 257/314–316, 391, 392, 402, 506, 524, 623, 257/E29.229, E29.3, E27.06, E27.061
See application file for complete search history.

(56) References Cited

U.S. PATENT DOCUMENTS

| 7,151,295 B2 * | 12/2006 | Yaegashi et al. ............. 257/316 |
| 7,402,499 B2 | 7/2008 | Kitamura et al. |
| 7,682,927 B2 * | 3/2010 | Hoshi et al. .................. 438/424 |
| 2007/0075336 A1 | 4/2007 | Sel et al. |

FOREIGN PATENT DOCUMENTS

| JP | 2006 339446 A | 12/2006 |
| KR | 10-0219475 B1 | 6/1999 |
| KR | 10-2007-0037949 A | 4/2007 |

* cited by examiner

*Primary Examiner* — Allison P Bernstein
(74) *Attorney, Agent, or Firm* — Lee & Morse, P.C.

(57) ABSTRACT

A semiconductor memory device and method of manufacturing the same, the device including string structures, the string structures including two or more adjacent string selection transistors connected in series to each other in a first direction and being spaced apart from one another in a second direction intersecting the first direction, the two or more string selection transistors having different threshold voltages; string selection lines, the string selection lines connecting the adjacent string selection transistors of the string structures in the second direction; and a bit line electrically connecting two or more adjacent string structures, wherein a device isolation layer between the adjacent string selection transistors in the second direction has recessed regions, and profiles of the recessed regions on respective sides of the string selection transistors are different from each other.

12 Claims, 17 Drawing Sheets

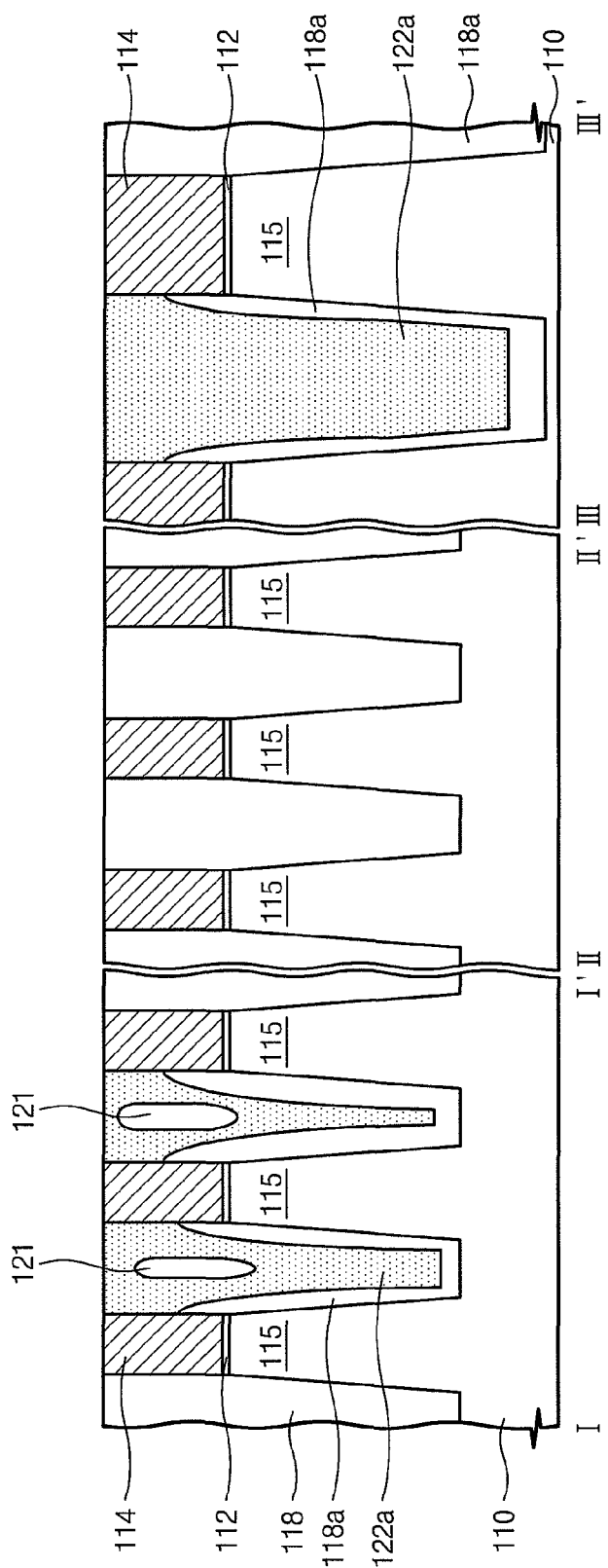

SEMICONDUCTOR DEVICES AND METHODS OF FABRICATING THE SAME

BACKGROUND

1. Field

Embodiments relate to semiconductor devices and methods of fabricating the same.

2. Description of the Related Art

Semiconductor memory devices used to store data may be classified into volatile memory devices and nonvolatile memory devices. The volatile memory devices lose the stored data when power is interrupted. However, the nonvolatile memory devices are capable of retaining the stored data even when power is interrupted.

In general, the nonvolatile memory devices are capable of electrically erasing and programming data and capable of storing the data even when power is interrupted. In recent years, accordingly, the nonvolatile memory devices have increasingly been used in various fields.

These nonvolatile memory devices are configured with various types of memory cell transistors. The nonvolatile memory devices are categorized into NAND-type nonvolatile memory devices and NOR-type nonvolatile memory devices according to a cell array structure. The NAND-type nonvolatile memory devices and the NOR-type nonvolatile memory devices have an advantage and a disadvantage in terms of high integration and high-speed performance, respectively.

In particular, the NAND-type nonvolatile memory devices may be advantageous in high integration due to a cell string in which a plurality of memory cell transistors are connected to each other in series. Moreover, information update speed of the NAND-type nonvolatile memory devices is considerably faster than that of the NOR-type nonvolatile memory devices, since the NAND-type nonvolatile memory devices may simultaneously change all information stored in the plurality of memory cell transistors. Due to the high integration and the fast information update speed, the NAND-type nonvolatile memory devices are mainly used in portable devices using a mass storage device, e.g., a digital camera or an MP3 player.

SUMMARY

Embodiments are directed to semiconductor devices and methods of fabricating the same, which represent advances over the related art.

It is a feature of an embodiment to provide a semiconductor device which includes transistors each having different threshold voltages connected to a single bit line.

It is another feature of an embodiment to provide a method of fabricating a semiconductor device which includes transistors each having different threshold voltages without performing an ion implantation process.

At least one of the above and other features and advantages may be realized by providing a semiconductor memory device including string structures, the string structures including two or more adjacent string selection transistors connected in series to each other in a first direction and being spaced apart from one another in a second direction intersecting the first direction, the two or more string selection transistors having different threshold voltages; string selection lines, the string selection lines connecting the adjacent string selection transistors of the string structures in the second direction; and a bit line electrically connecting two or more adjacent string structures, wherein a device isolation layer between the adjacent string selection transistors in the second direction has recessed regions, and profiles of the recessed regions on respective sides of the string selection transistors are different from each other.

The string structures may include memory transistors connected in series to the string selection transistors in the first direction.

The string structures may further include a ground selection transistor connected in series to one side of the memory transistors facing the string selection transistors.

The bit line may be electrically connected to the one side of the string selection transistors facing the memory transistors.

The string selection transistors may each include a sequentially stacked charge storage pattern and gate electrode such that a plurality of the string selection transistors entail a plurality of charge storage patterns and gate electrodes.

The recessed regions may be between the charge storage patterns of the string selection transistors.

The recessed regions may expose at least a portion of sidewalls of the charge storage patterns.

Depths of the recessed regions on respective sides of the string selection transistors may be different from each other.

The recessed regions may have a profile in which a width thereof narrows toward a lower portion thereof.

One of the string selection transistors associated with one of the recessed regions may have a threshold voltage higher than a string selection transistor associated with another of the recessed regions having a deeper depth.

At least one of the above and other features and advantages may also be realized by providing a method of fabricating a semiconductor device, the method including forming trenches defining active regions by patterning a substrate; forming first device isolation layers that fill the trenches; forming a mask pattern such that the mask pattern exposes at least one of the first device isolation layers after forming the first device isolation layers; forming a first device isolation pattern having a recessed region by removing a portion of the one first device isolation layer exposed through the mask pattern; removing the mask pattern; forming a second device isolation layer that fills the recessed region after forming the first device isolation pattern; and forming device isolation layers having different surface profiles on respective sides of the active regions by recessing the second device isolation layer and the first device isolation pattern.

The method may further include sequentially forming a gate insulating layer and a charge storage layer on the substrate prior to forming the trenches, wherein the charge storage layer and the gate insulating layer are formed as charge storage structures by patterning the substrate.

Threshold voltages of the transistors including the charge storage structures on the active regions may be adjusted according to a recessed depth of the device isolation layer.

The first device isolation layer may include Tonen Silazene (TOSZ).

The second device isolation layer may include silicon oxide.

Forming the second device isolation layer may include forming a void therein.

The void may impart different surface profiles to the device isolation layers on respective sides of the active regions.

The second device isolation layer may have an etch selectivity higher than that of the first device isolation layer.

At least one of the above and other features and advantages may also be realized by providing a semiconductor device including device isolation layers defining active regions on a substrate; and transistors on the active regions, wherein the device isolation layers have recessed regions, profiles of the recessed regions on respective sides of the transistors are different from each other, and the transistors have different threshold voltages from one another.

The threshold voltages of the transistors may be inversely proportional to recessed depths of the recessed regions.

BRIEF DESCRIPTION OF THE DRAWINGS

The above and other features and advantages will become more apparent to those of ordinary skill in the art by describing in detail exemplary embodiments with reference to the attached drawings, in which:

FIGS. 4A through 4H illustrate sectional views of stages in a method of fabricating the nonvolatile memory device taken along the lines I-I', II-II', and III-III' of FIGS. 2A and 2B, according to an embodiment;

DETAILED DESCRIPTION

Figure 1:
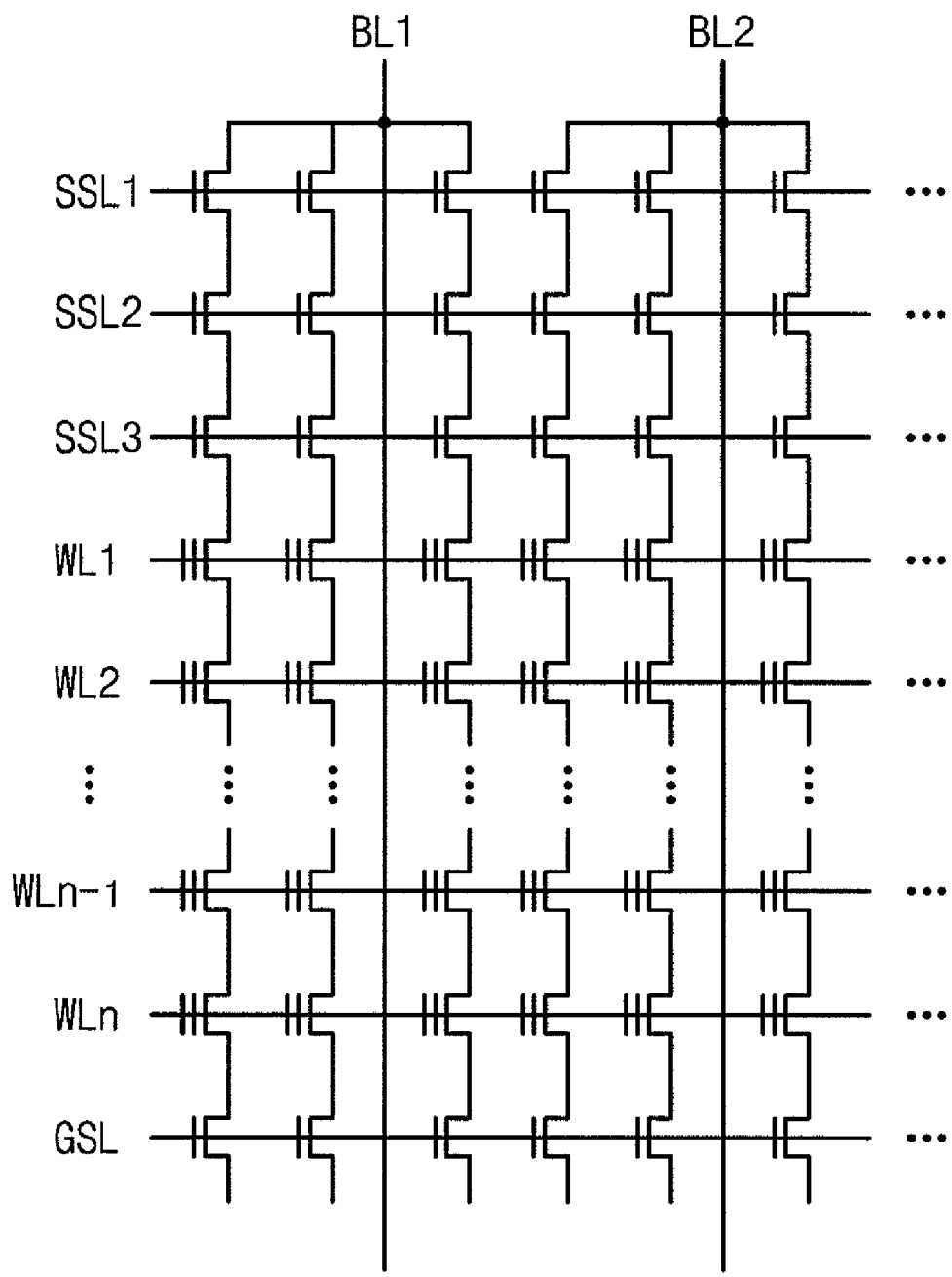
FIG. 1 illustrates a circuit diagram of a nonvolatile memory device according to an embodiment.

Korean Patent Application No. 10-2009-0075278, filed on Aug. 14, 2009, in the Korean Intellectual Property Office, and entitled: "Semiconductor Devices and Methods of Fabricating the Same," is incorporated by reference herein in its entirety.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey the scope of the invention to those skilled in the art.

In the drawing figures, the dimensions of layers and regions may be exaggerated for clarity of illustration. It will also be understood that when a layer or element is referred to as being "on" another layer or substrate, it can be directly on the other layer or substrate, or intervening layers may also be present. In addition, it will also be understood that when a layer is referred to as being "between" two layers, it can be the only layer between the two layers, or one or more intervening layers may also be present. Like reference numerals refer to like elements throughout.

The terminology used herein is for the purpose of describing various embodiments only and is not intended to be limiting of exemplary embodiments. As used herein, the singular forms "a," "an," and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. Reference numerals presented are not necessarily limited to the described order, since reference numerals are presented according to the preferred embodiments. In addition, it will be understood that when a layer is referred to as being "on" another layer or a substrate, it may be directly on another layer or substrate or intervening layers may be present.

Exemplary embodiments are described herein with reference to cross-sectional illustrations and/or plane illustrations that are schematic illustrations of idealized embodiments of exemplary embodiments. Accordingly, variations from the shapes of the illustrations as a result, for example, of manufacturing techniques and/or tolerances, are to be expected. Thus, exemplary embodiments should not be construed as limited to the shapes of regions illustrated herein but are to include deviations in shapes that result, for example, from manufacturing. For example, an etching region illustrated as a rectangle will, typically, have rounded or curved features. Thus, the regions illustrated in the figures are schematic in nature and their shapes are not intended to illustrate the actual shape of a region of a device and are not intended to limit the scope of exemplary embodiments.

FIG. 1 illustrates a circuit diagram schematically showing a nonvolatile memory device according to an embodiment.

Referring to FIG. 1, the nonvolatile memory device may include a plurality of string structures. Each string structure may include, e.g., two or more string selection transistors having different threshold voltages (Vth) and being connected in series so as to be adjacent to each other in a first direction; a plurality of memory transistors connected in series to the string selection transistors; and a ground selection transistor connected in series to one side of the plurality of memory transistors facing the string selection transistors.

The nonvolatile memory device may include, e.g., string selection lines SSL1, SSL2, and SSL3 electrically connecting the string selection transistors of the plurality of string structures in a second direction intersecting the first direction; word lines WL1, WL2, . . . , WLn-1, and WLn electrically connecting the memory transistors of the plurality of string structures in the second direction; and a ground selection line GSL electrically connecting the ground selection transistors of the plurality of string structures in the second direction.

The nonvolatile memory device may include bit lines BL1 and BL2 electrically connected to two or more adjacent string structures in common. The bit lines BL1 and BL2 may be electrically connected to one side of the string selection transistors facing the memory transistors. The nonvolatile memory device may include two or more bit lines.

In the nonvolatile memory device having the above-described configuration, since two or more adjacent string structures may be electrically connected to one bit line BL1 or BL2, a design rule of the nonvolatile memory device may be improved. The string selection transistors for selecting one of the string structures sharing one bit line BL1 or BL2 may be configured to have different threshold voltages from one another.

In an implementation, when two string structures are electrically connected to one bit line BL1 or BL2, each of the string structures may include two string selection transistors. The two string selection transistors may be a depletion transistor or an enhancement transistor having different threshold voltages from one another. The string selection lines SSL1 and SSL2 may electrically connect the string selection transistors of two string structures to each other in the second direction. That is, one string selection line SSL1 or SSL2 may be electrically connected to the depletion transistor and the enhancement transistor in an alternate manner.

In another implementation, when three string structures are electrically connected to one bit line BL1 or BL2, each of the string structures may include three string selection transistors. The three string selection transistors may be transistors having different threshold voltages from one another, that is, a low threshold voltage transistor, a middle threshold voltage transistor, and a high threshold voltage transistor. The string selection lines SSL1, SSL2, and SSL3 may electrically connect the string selection transistors of the three string structure to one another. That is, one string selection line SSL1, SSL2, or SSL3 may be electrically connected to the low threshold voltage transistor, the middle threshold voltage transistor, and the high threshold voltage transistor in an alternate manner.

The string selection transistors each having different threshold voltages may serve as switches to select a specific string structure among the plurality of string structures electrically connected to a single bit line BL1 or BL2.

Figure 2A:
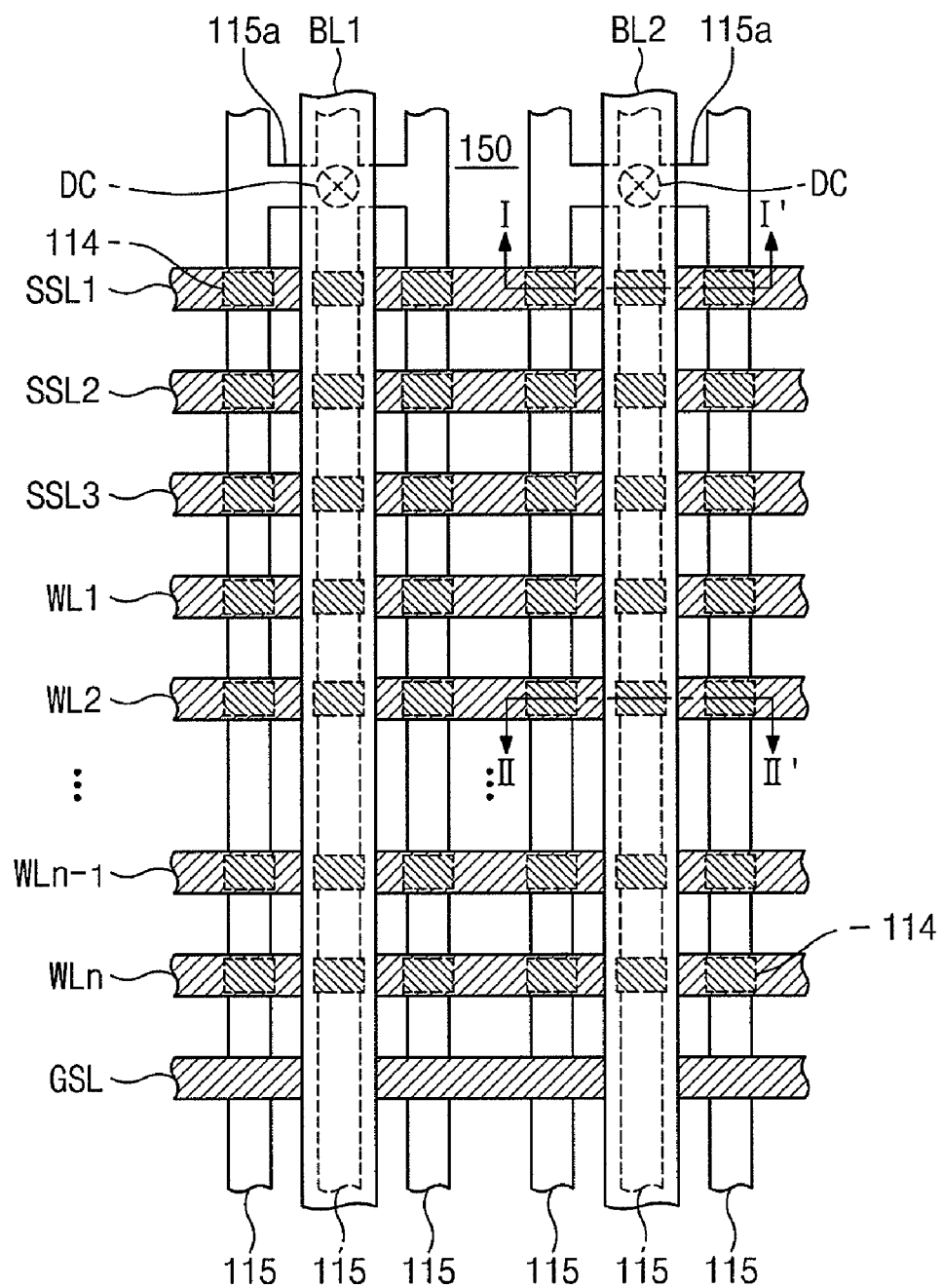
FIGS. 2A and 2B respectively illustrate plan views of a cell region and a peripheral circuit region of the nonvolatile memory device according to an embodiment.
Figure 2B:
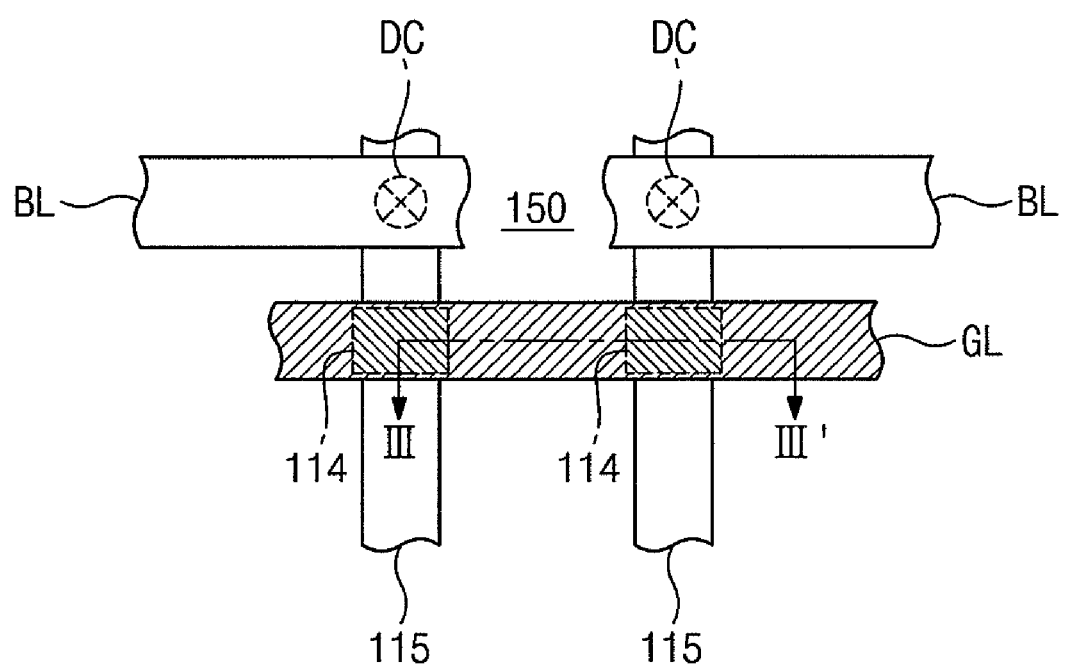
Figure 3:
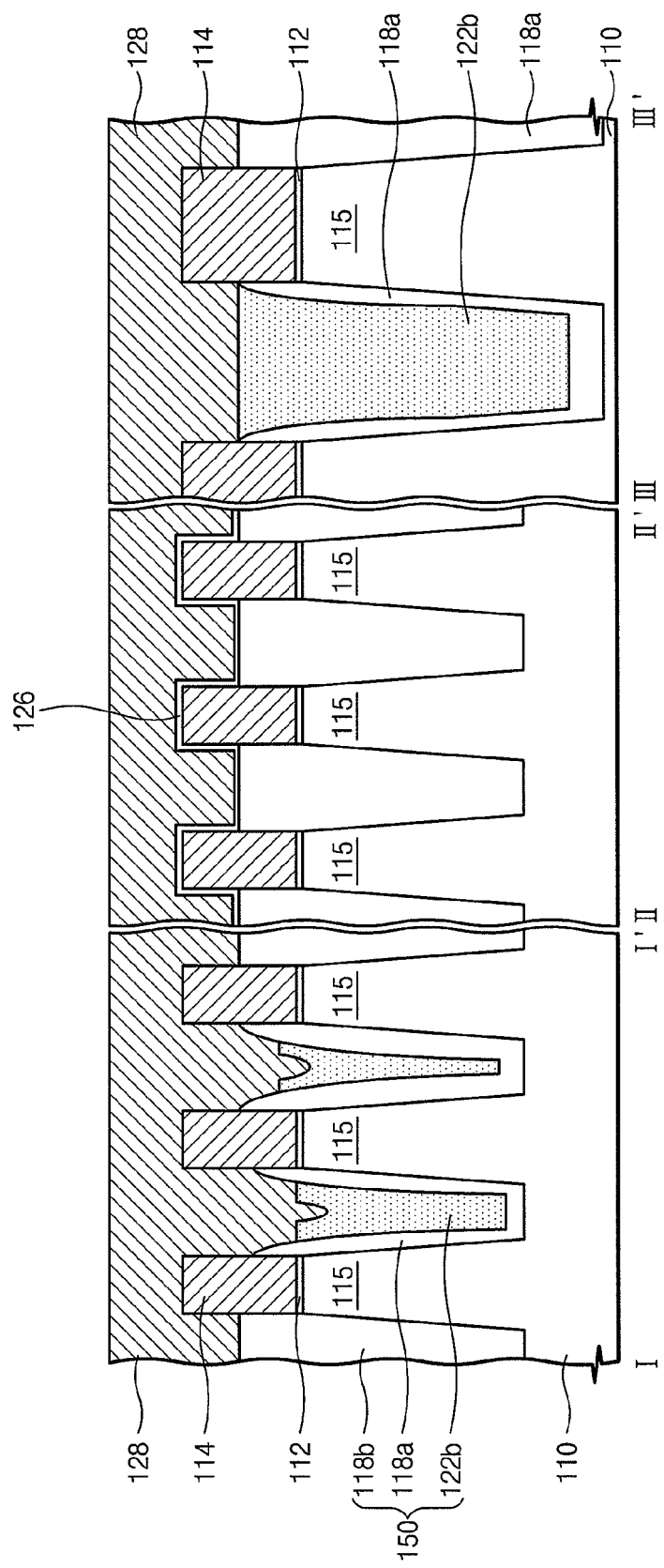
FIG. 3 illustrates a sectional view of the nonvolatile memory device taken along the lines I-I', II-II', and III-III' of FIGS. 2A and 2B.

FIGS. 2A and 2B respectively illustrate plan views of a cell region and a peripheral circuit region of the nonvolatile memory device according to an embodiment. FIG. 3 illustrates a sectional view of the nonvolatile memory device taken along the lines I-I', II-II' and III-III' of FIGS. 2A and 2B. Here, the line I-I' crosses a string selection transistor region in a cell region, the line II-II' crosses a memory transistor region in the cell region, and the line III-III' crosses a part of the peripheral circuit region.

Referring to FIGS. 2A, 2B, and 3, the cell region of the nonvolatile memory device may include a substrate 110, a device isolation pattern 150, active regions 115, active bridge patterns 115a, charge storage patterns 114, the string selection lines SSL1, SSL2, and SSL3, word lines WL1, WL2, . . . , WLn−1, and WLn, a ground selection line GSL, a bit line contact DC, and the bit lines BL1 and BL2. The peripheral circuit region of the nonvolatile memory device may include a substrate 110, a device isolation pattern 150, active regions 115, charge storage patterns 114, a gate line GL, a bit line contact DC, and a bit line BL.

The device isolation pattern 150 may fill trench regions formed in predetermined regions of the substrate 110. The device isolation pattern 150 may define the plurality of parallel active regions 115 and the active bridge patterns 115a that connect two or more active regions 115 to each other.

Parts of the string selection lines SSL1, SSL2, and SSL3, the word lines WL1, WL2, . . . , WLn−1, and WLn, and the ground selection line GSL overlapping with the active regions 115 in an extension direction of the active regions 115 in the cell region may be one string structure. The string selection lines SSL1, SSL2, and SSL3, the word lines WL1, WL2, . . . , WLn−1, and WLn, and the ground selection line GSL may intersect the plurality of active regions 115 parallel to one side of the active bridge pattern 115a. The string selection lines SSL1, SSL2, and SSL3, the word lines WL1, WL2, . . . , WLn−1, and WLn, and the ground selection line GSL may be further symmetrically-provided on the other side of the active bridge pattern 115a. The string selection lines SSL1, SSL2, and SSL3, the word lines WL1, WL2, . . . , WLn−1, and WLn, and the ground selection line GSL may be provided so as to be parallel to each other.

The charge storage patterns 114 may be interposed between the string selection lines SSL1, SSL2, and SSL3 and the word lines WL1, WL2, . . . , WLn−1, and WLn overlapping with the plurality of active regions 115. Gate insulating patterns 112 may be interposed between the charge storage patterns 114 and the active regions 115. Gate interlayer insulating layers 126 may be further interposed between the charge storage patterns 114 and the word lines WL1, WL2, . . . , WLn−1, and WLn.

In the string selection transistor region of the cell region, a string selection transistor may include the gate insulating pattern 112, the charge storage pattern 114, and the string selection line SSL1, SSL2, or SSL3 sequentially formed on the substrate 110. In the memory transistor region of the cell region, a memory transistor may include the gate insulating pattern 112, the charge storage pattern 114, the gate interlayer insulating layer 126, and the word line WL1, WL2, . . . , WLn−1, or WLn sequentially formed on the substrate 110. In the memory transistor region of the cell region, the gate insulating pattern 112 may be a tunnel insulating layer. In the peripheral circuit region, a peripheral circuit transistor may include the gate insulating pattern 112, the charge storage pattern 114, and the gate line GL sequentially formed on the substrate 110. In the peripheral circuit region, the charge storage pattern 114 may be omitted.

The bit line contacts DC may be provided on the active regions 115 or the active bridge patterns 115a to electrically connect the two or more adjacent active regions 115 to the bit lines BL1 and BL2 in the cell region and to electrically connect the active region 115 to the bit line BL in the peripheral circuit region.

In the nonvolatile memory device having the above-described configuration, the design rule of the nonvolatile memory device may be improved since two or more adjacent active regions 115 may be electrically connected to a single bit line BL1 or BL2. In order to select one of the active regions 115 sharing one bit line BL1 or BL2, the string selection transistors may be configured to have different threshold voltages, respectively.

When two active regions 115 are electrically connected to a single bit line BL1 or BL2, two string selection transistors may be provided on one active region 115. The two string selection transistors may be a depletion transistor and an enhancement transistor having different threshold voltages, respectively. The string selection lines SSL1 and SSL2 may electrically connect the string selection transistors to each other in the two active regions 115. That is, one string selection line SSL1 or SSL2 may be electrically connected to the depletion transistor and the enhancement transistor in an alternate manner.

When three active regions 115 are electrically connected to one bit line BL1 or BL2, three string selection transistors may be provided on one active region 115. The three string selection transistors may be, e.g., a low threshold voltage transistor, a middle threshold voltage transistor, and a high threshold voltage transistor, i.e., having different threshold voltages. The string selection lines SSL1, SSL2, and SSL3 may electrically connect the string selection transistors to each other in the three active regions 115. That is, one string selection line SSL1, SSL2, or SSL3 may be electrically connected to the low threshold voltage transistor, the middle threshold voltage transistor, and the high threshold voltage transistor in an alternate manner.

The string selection transistors each having different threshold voltages may serve as switches to select a specific active region out of the plurality of active regions 115 electrically connected to one bit line BL1 or BL2.

Referring again to FIG. 3, the nonvolatile semiconductor memory device may include device isolation patterns 150 in the substrate 110 to define the active regions 115, the charge storage patterns 114 on the active regions 115, respectively, and a gate electrode 128 covering the substrate 110 provided with the charge storage patterns 114. In the memory transistor region, a gate interlayer insulating layer 126 may be formed between the charge storage pattern 114 and the gate electrode 128.

The device isolation patterns 150 may include a first device isolation pattern 118a, a first recessed device isolation pattern 118b, and/or a second recessed device isolation pattern 122b, according to located levels. Recessed regions of the device isolation patterns 150 may exist between the charge storage patterns 114. The recessed regions of the device isolation patterns 150 may expose at least a portion of a sidewall of the charge storage patterns 114. In the string selection transistor region, the recessed region of the device isolation pattern 150 between the charge storage patterns 114 may have a profile in which a width thereof becomes narrower toward a lower portion thereof.

The gate interlayer insulating layer 126 may be formed along a profile of the charge storage patterns 114 and the first recessed device isolation patterns 118b in the memory transistor region. The gate electrode 128 may be formed on the gate interlayer insulating layer 126 so as to fill the recessed regions of the device isolation pattern 150 between the charge storage patterns 114.

In the string selection transistor region, the charge storage patterns 114 and the gate electrode 128 sequentially stacked on the active regions 115 may form the string selection transistors. In the memory transistor region, the charge storage patterns 114, the gate interlayer insulating layer 126, and the gate electrode 128 sequentially stacked on the active regions 115 may form the memory transistor. In the peripheral circuit region, the charge storage patterns 114 and the gate electrode 128 sequentially stacked on the active regions 115 may form the peripheral circuit transistor. The gate electrode 128 may extend to become the string selection line SSL1, SSL2, or SSL3, the word line WL1, WL2, ..., WLn−1, or WLn, and the gate line GL. The transistors may further include the gate insulating patterns 112 interposed between the substrate 110 and the charge storage patterns 114. The charge storage patterns 114 may be a floating gate formed of polysilicon. In the memory transistor region, when the charge storage patterns 114 are the floating gate, the gate interlayer insulating layer 126 may be an oxide/nitride/oxide (ONO) dielectric layer. Alternatively, the charge storage patterns 114 may be a charge trapping layer formed of nitrides, silicon nitrides, or the like. In the memory transistor region, when the charge storage patterns 114 are the charge trapping layer, the gate interlayer insulating layer 126 may be a blocking insulating layer.

The threshold voltage of a transistor may become lower as a recessed degree of the recessed region in the device isolation pattern becomes larger. Thus, the threshold voltage of the string selection transistor may be adjusted according to the recessed degree of the device isolation patterns between the charge storage patterns 114 that are adjacent to each other in the string selection transistor region.

FIGS. 4A through 4H illustrate sectional views of stages in a method of fabricating the nonvolatile memory device according to an embodiment, taken along the lines I-I', II-II' and III-III' of FIGS. 2A and 2B. FIGS. 5A and 5B illustrate plan views of the cell region and the peripheral circuit region of the nonvolatile memory device to describe the process illustrated in FIG. 4B.

Figure 4A:
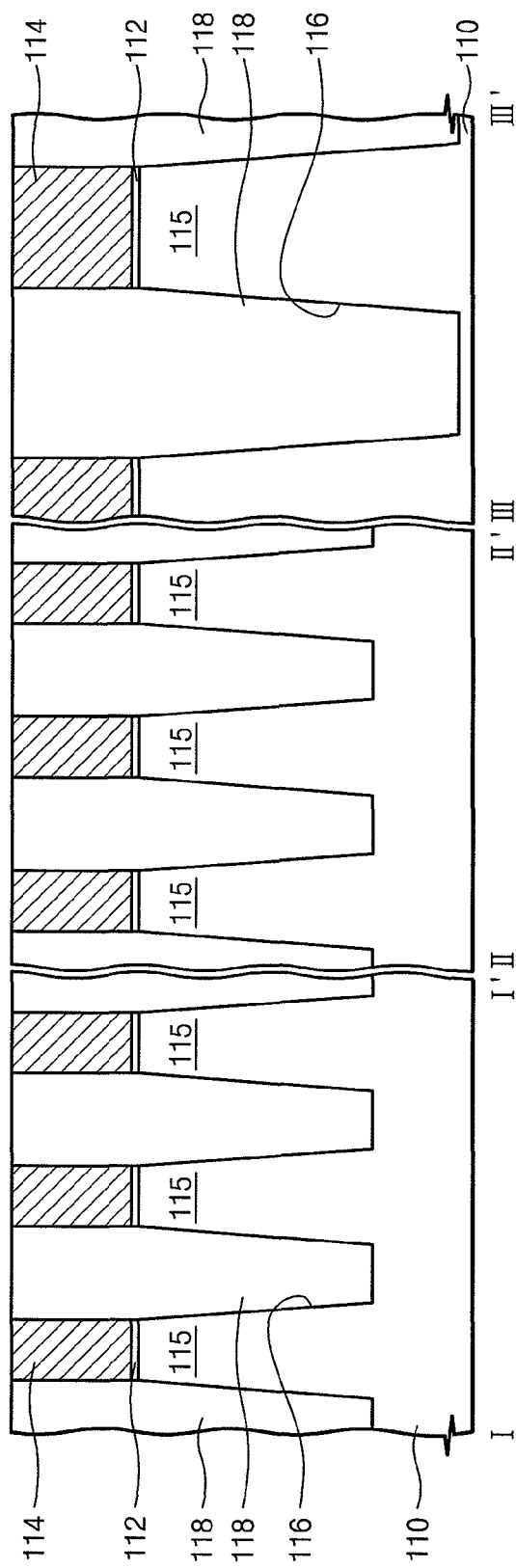
Figure 5A:
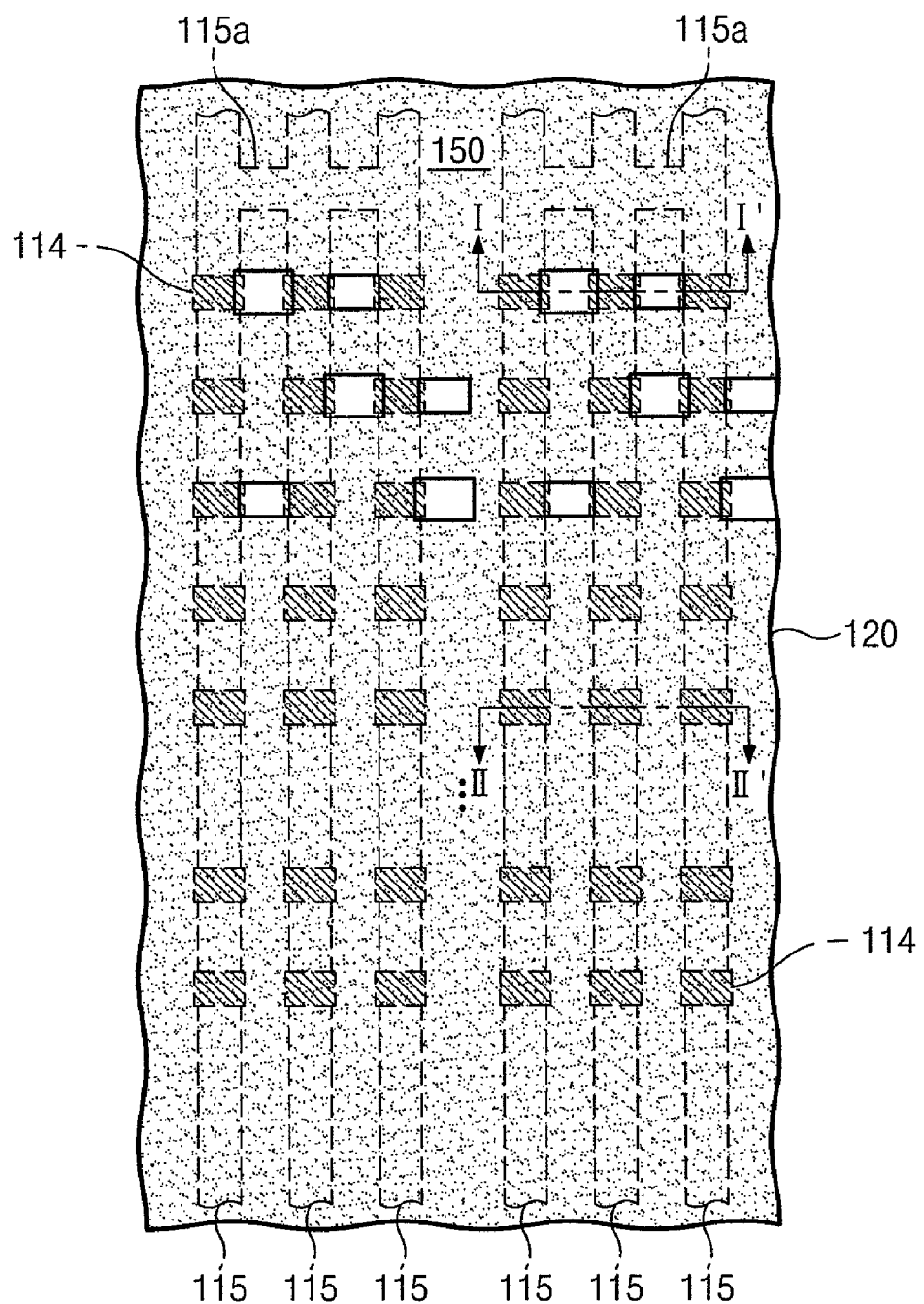
FIGS. 5A and 5B respectively illustrate plan views of a cell region and a peripheral circuit region of the nonvolatile memory device to describe a process illustrated in FIG. 4B.
Figure 5B:
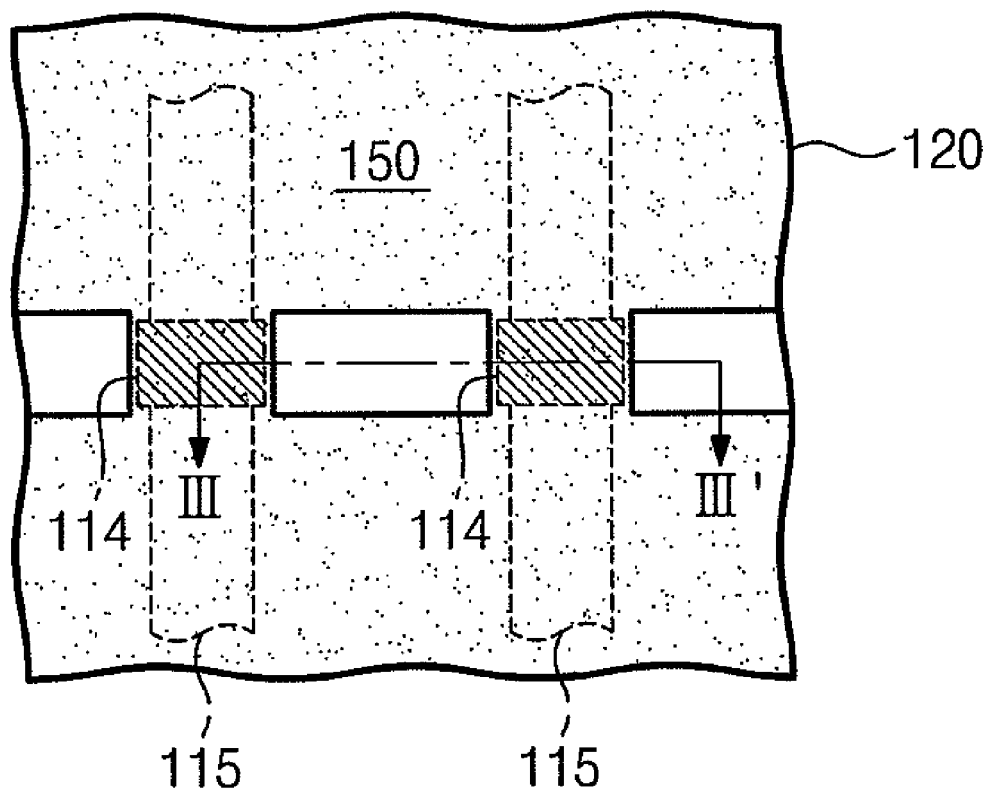

Referring to FIG. 4A, a gate insulating layer and a charge storage layer may be sequentially formed on the substrate 110. The substrate 110 may be a silicon (Si) substrate.

In order to form charge storage structures including the gate insulating patterns 112 and the charge storage patterns 114, trenches 116 may be formed by patterning the charge storage layer, the gate insulating layer, and the substrate 110.

First device isolation layers 118 may be formed to fill the trenches 116. The first device isolation layer 118 may contain, e.g., TOnen SilaZene (TOSZ). Preferably, the first device isolation layer 118 contains Phosphosilicate Spin-On-Glass (P-SOG)-based TOSZ. The P-SOG-based TOSZ is a material that has excellent gap filling ability and has a relatively small susceptibility to the design rule or the profile of the trench. The first device isolation layers 118 may be formed by, e.g., a spin-on-glass technique.

The forming of the first device isolation layers 118 may include forming the first device isolation layer 118 to cover the substrate 110 on which the trenches 116 are formed and then planarizing the first device isolation layer 118 to expose upper surfaces of the charge storage patterns 114. The first device isolation layer 118 may be planarized by a Chemical Mechanical Polishing (CMP) process.

Referring to FIGS. 4B, 4C, 5A, and 5B, a mask pattern 120 may be formed on the substrate 110 having the first device isolation layers 118 thereon. The mask pattern 120 may expose the first device isolation layers 118 in the peripheral circuit region and the first device isolation layers 118 in the string selection transistor region. The mask pattern 120 may completely cover the memory transistor region.

The first device isolation patterns 118a may be formed by removing parts of the first device isolation layers 118 exposed by the mask pattern 120 to expose at least a portion of sidewalls of the charge storage patterns 114. The first device isolation patterns 118a may be formed by etching the first device isolation layers 118 through an etching process using the mask pattern 120 as a mask.

The first device isolation layer 118 containing TOnen SilaZene (TOSZ) may not be enough to make a sufficient device isolation property in the peripheral circuit region. Therefore, the first device isolation patterns 118a may be formed so as to provide an additional device isolation layer 122 (see FIG. 4D) having a sufficient device isolation property. The first device isolation patterns 118a may be formed in the string selection transistor region to adjust the threshold voltages of the string selection transistors. That is, the mask pattern 120 may include openings that allow for removal of a part of the first device isolation layers 118 in the peripheral circuit region and openings exposing the first device isolation layers 118 in the string selection transistor region. A mask pattern 120 may be replaced by a known reticle. The reticle may be used in a process of implanting impurity ions to the string selection transistor region. Alternatively, the mask pattern 120 may be used by overlapping the mask pattern used for removing a part of the device isolation layer in the peripheral circuit region and the known reticle used in the process of implanting impurity ions to the string selection transistor region.

In the mask pattern 120 exposing the first device isolation layers 118 in the string selection transistor region, shapes or dimensions of the openings may be different from each other. Accordingly, the respective first device isolation patterns 118a between the charge storage patterns 114 in the string selection transistor region may have different shapes.

After the first device isolation patterns 118a are formed in the peripheral circuit region and the string selection transistor region, the mask pattern 120 may be removed.

Figure 4B:
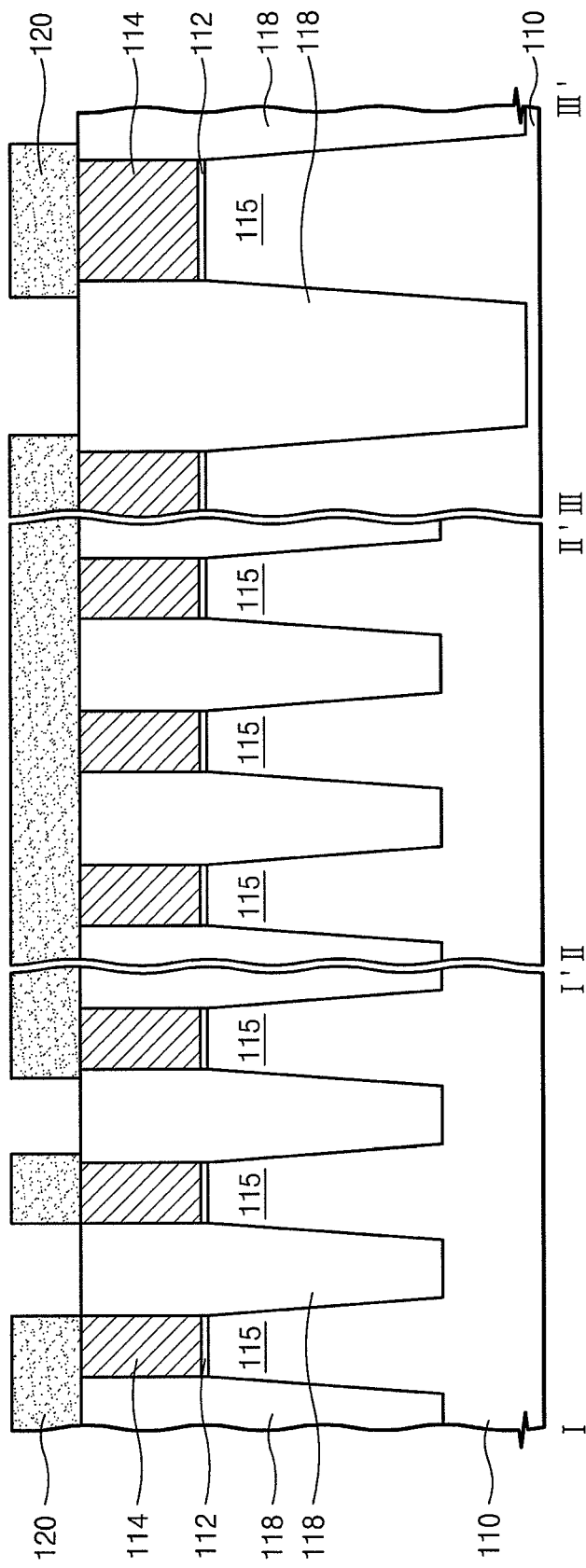
Figure 4C:
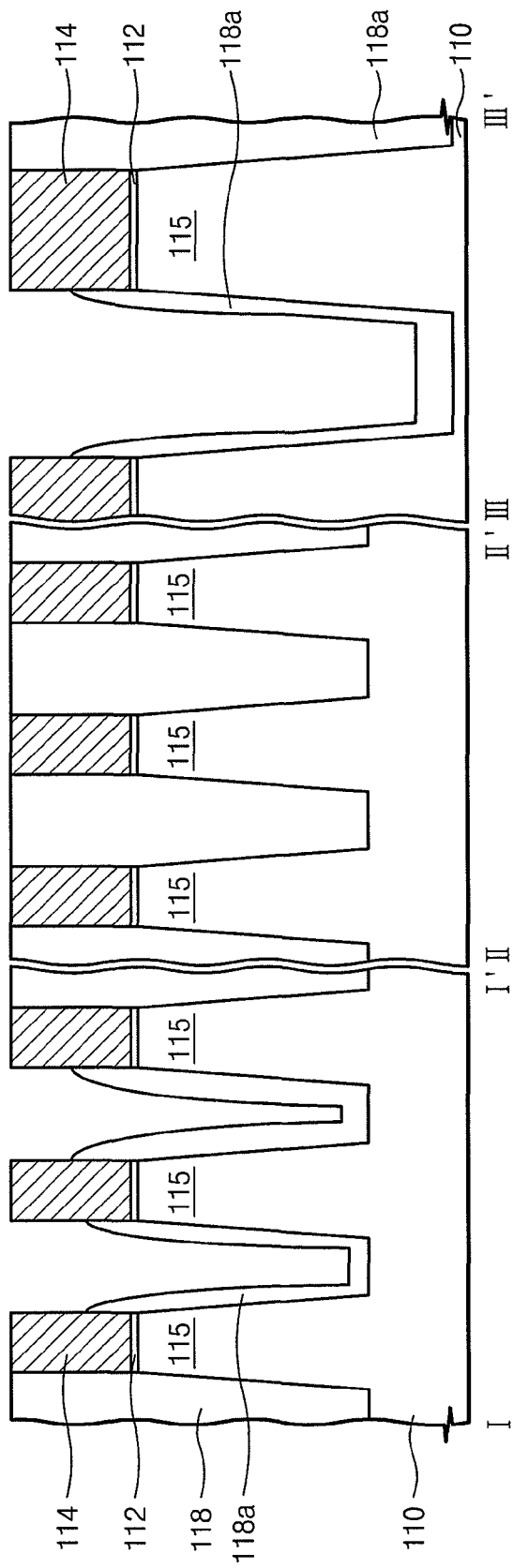
Figure 4D:
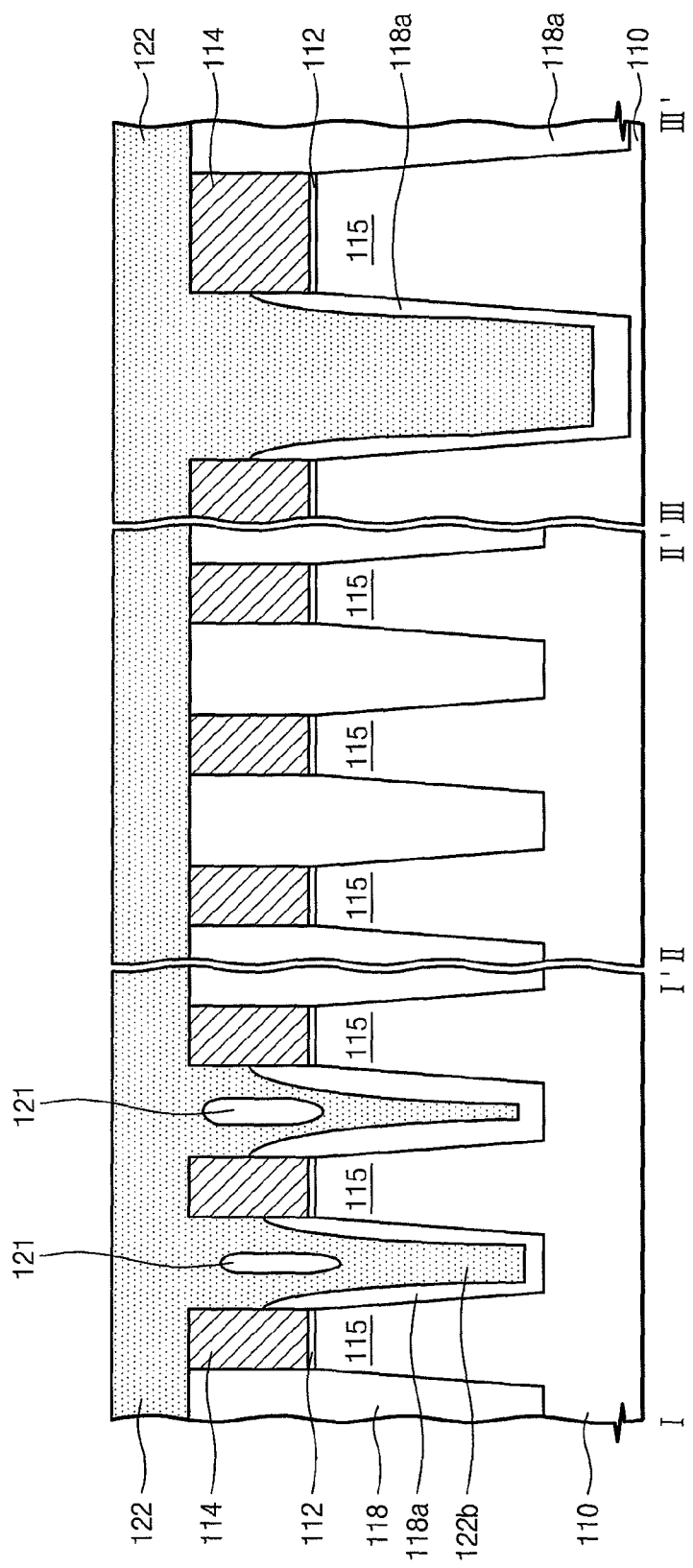

Referring to FIGS. 4D and 4E, second device isolation patterns 122a may fill spaces between the charge storage patterns 114 on the substrate 110. The forming of the second device isolation patterns 122a may include forming the second device isolation layer 122 to cover the substrate 110 having the first device isolation patterns 118a thereon and then planarizing the second device isolation layer 122 to expose upper surfaces of the charge storage patterns 114. The second device isolation layer 122 may contain, e.g., silicon oxides. The second device isolation layer 122 may be planarized by a CMP process.

In the string selection transistor region, each of the second device isolation patterns 122a may be formed so as to have a void 121 therein. This is because the second device isolation layer 122 may be inferior to the first device isolation layer 118 in terms of gap filling ability and because a width between the charge storage patterns 114 in the string selection transistor region may be narrower than a width between the charge storage patterns 114 in the peripheral circuit region. That is, the void 121 may not be formed in a space between the charge storage patterns 114 on the first device isolation pattern 118a in the peripheral circuit region, but may be formed only in a space between the charge storage patterns 114 on the first device isolation pattern 118a in the string selection transistor region.

Since the first device isolation patterns 118a between the charge storage patterns 114 in the string selection transistor region may have different shapes from one another, the spaces between the charge storage patterns 114 on the first device isolation patterns 118a in the string selection transistor region may also have different shapes from one another. Since these spaces having the different shapes may be filled with the second device isolation patterns 122a in the string selection transistor region, the second device isolation patterns 122a may also have different shapes from one another. Further, the voids 121 formed in the second device isolation patterns 122a may have different shapes and positions from one another.

Figure 4F:
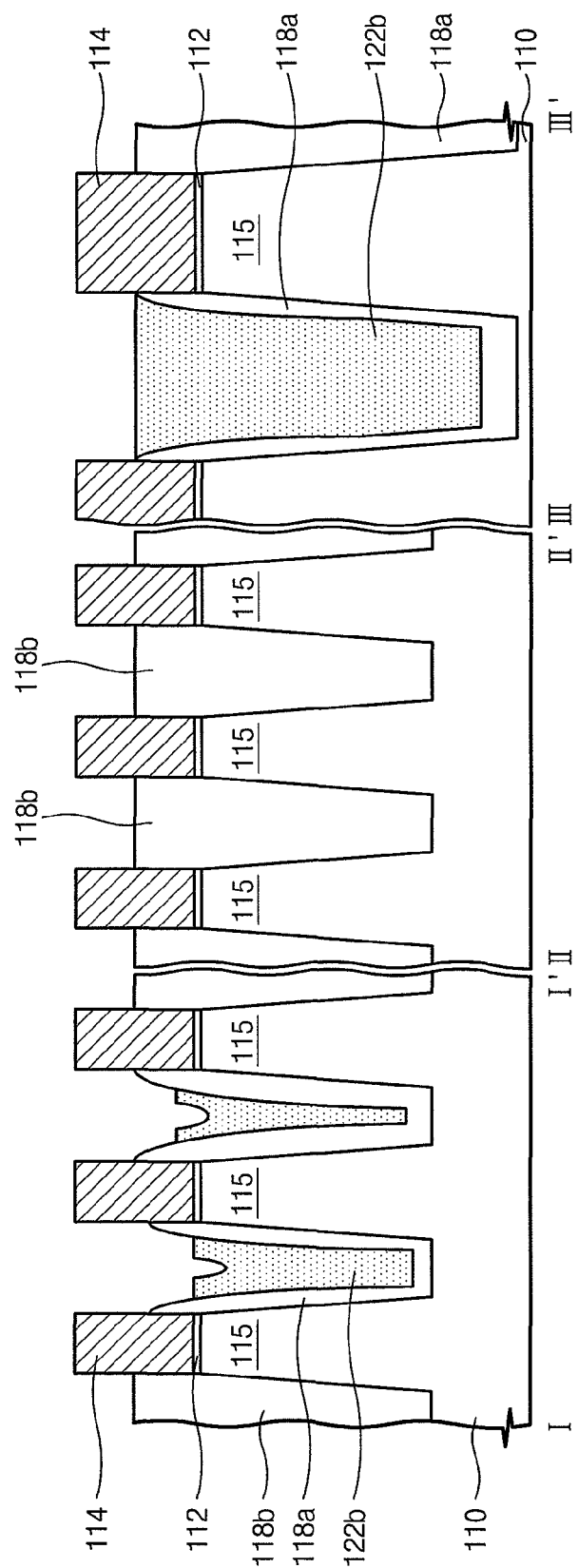

Referring to FIG. 4F, the second device isolation patterns 122a, the first device isolation patterns 118a, and the first device isolation layers 118 may be recessed. The reason for recessing the second device isolation patterns 122a, the first device isolation patterns 118a, and the first device isolation layers 118 is to form recessed second device isolation patterns 122b and recessed first device isolation patterns 118b by etching the second device isolation patterns 122a, the first device isolation patterns 118a, and the first device isolation layers 118 through an etching process using the charge storage patterns 114 as a mask.

Since the second device isolation layer 122 may have an etch selectivity higher than that of the first device isolation layer 118 and the second device isolation patterns 122a in the string selection transistor region may have the void 121 therein, the recessed space on the device isolation pattern configured to have the first device isolation patterns 118a and the recessed second device isolation patterns 122b in the string selection transistor region may become narrower toward a lower portion thereof.

The device isolation pattern in the string selection transistor region may be configured to have the first device isolation pattern 118a and the recessed second device isolation pattern 122b. The device isolation pattern in the memory transistor region may be configured to have the first device isolation pattern 118b. The device isolation pattern in the peripheral circuit region may be configured to have the first device isolation pattern 118a and the recessed second device isolation pattern 122b.

By adjusting the openings of the mask pattern 120 illustrated in FIG. 4B, the recessed degrees of the recessed second device isolation patterns 122b in the string selection transistor may be different. Alternatively, the recessed degrees of the recessed second device isolation patterns 122b in the string selection transistor region may be different by using an additional mask pattern having another opening.

Figure 4G:
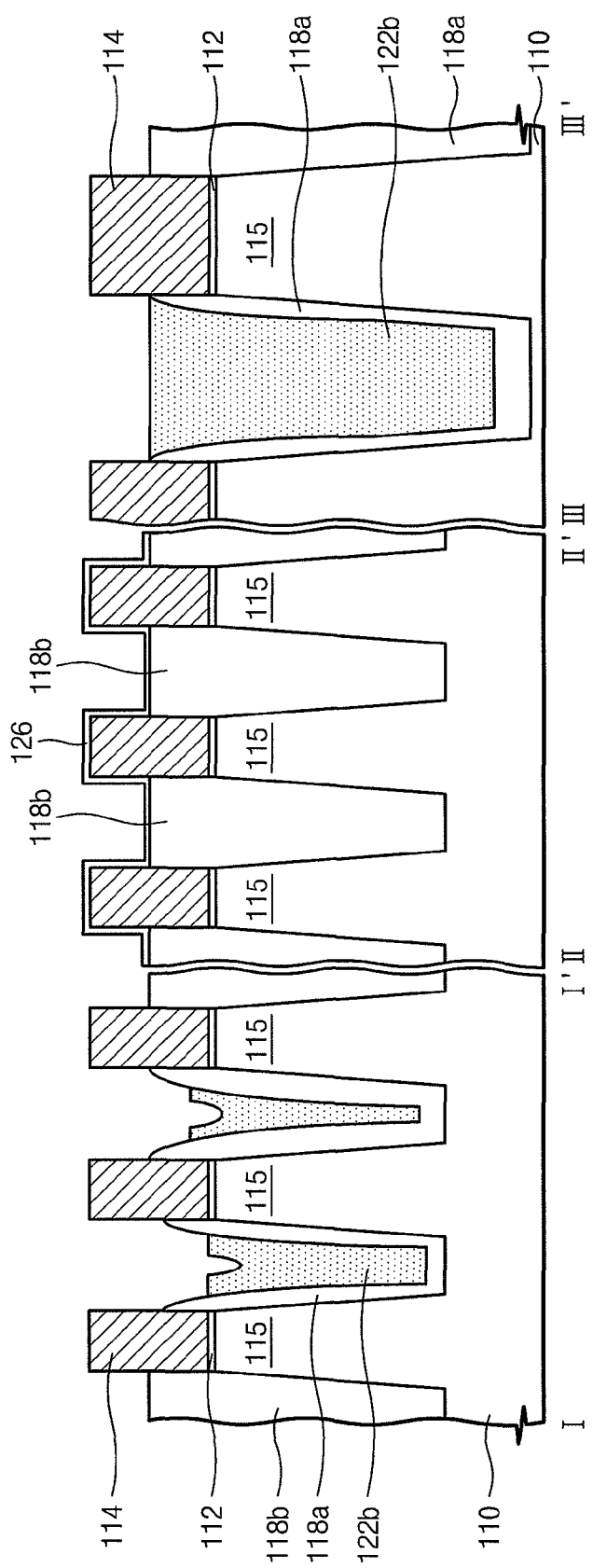
Figure 4H:
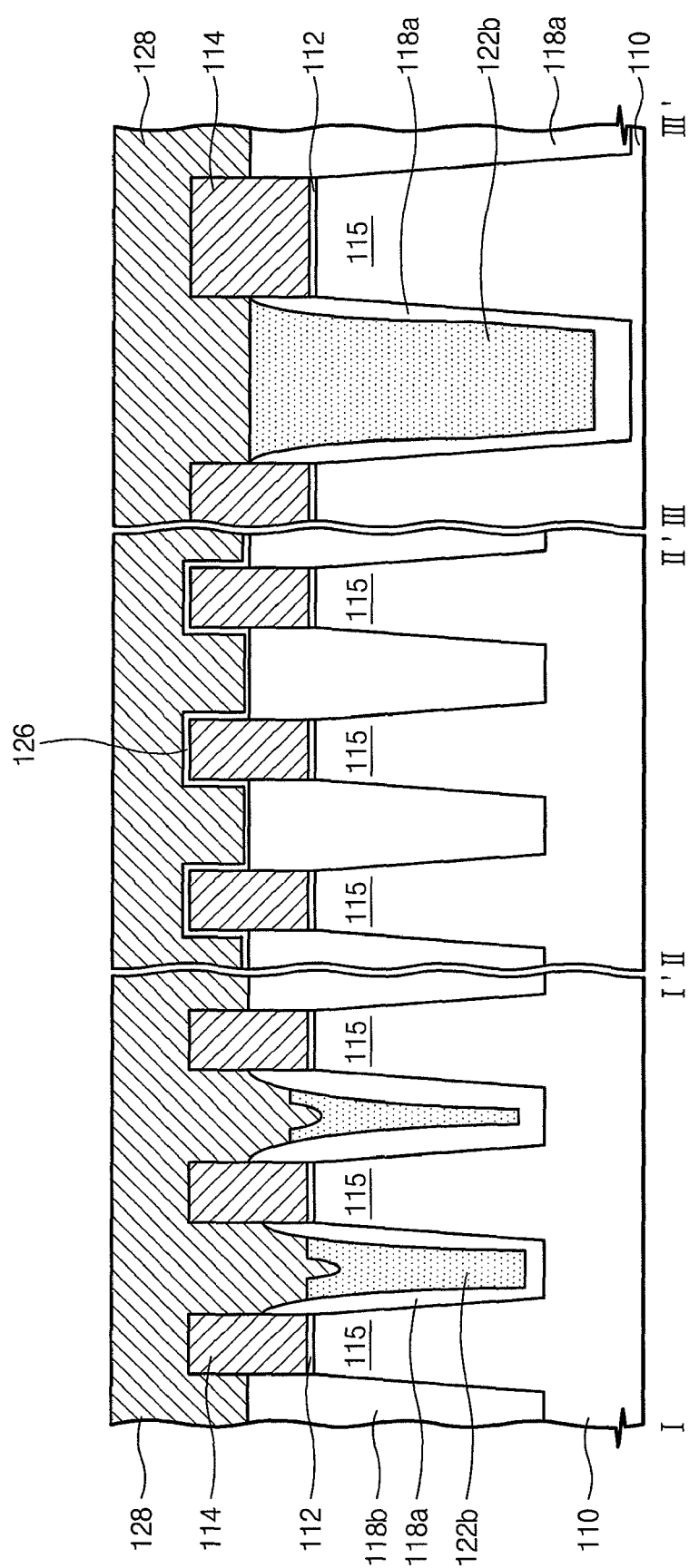

Referring to FIGS. 4G and 4H, the gate interlayer insulating layer 126 may be formed along the profiles of the charge storage patterns 114 and the recessed first device isolation patterns 118b in the memory transistor region. Then, the gate electrode 128 may be formed on an entire surface of the substrate 110 to fill spaces between the charge storage patterns 114.

In the string selection transistor region, the gate insulating pattern 112, the charge storage pattern 114, and the gate electrode 128 sequentially provided on the active region 115 may form the string selection transistor. In the memory transistor region, the gate insulating pattern 112, the charge storage pattern 114, the gate interlayer insulating layer 126, and the gate electrode 128 sequentially provided on the active region 115 may form the memory transistor. In the peripheral circuit region, the gate insulating pattern 112, the charge storage pattern 114, and the gate electrode 128 sequentially provided on the active region 115 may form the peripheral transistor.

That is, the string selection transistors having different threshold voltages from one another, which are formed on the parallel active regions 115, respectively, may be electrically connected by the gate electrode 128 serving as the string selection line SSL1 (see FIG. 2A).

The threshold voltages of the string selection transistors including the charge storage pattern 114 may be adjusted according to the recessed degree of the recessed second device isolation pattern 122b in the string selection transistor region. This is due to differences in a coupling degree between the gate electrode 128 and the active regions 115.

As the recessed degree of the recessed second device isolation pattern 122b increases, the threshold voltage of the transistor including the charge storage pattern 114 may become lower. In FIG. 4H, the transistor including the charge storage pattern 114 located at the right of the string selection transistor region may have a relatively high threshold voltage. The transistor including the charge storage pattern 114 located at the center of the string selection transistor region may have a relatively low threshold voltage. The transistor including the charge storage pattern 114 located at the left side of the string selection transistor region may have a threshold voltage between the relatively high and relatively low threshold voltages.

When two active regions 115 are electrically connected to one bit line BL1 or BL2 (see FIG. 2A), two string selection transistors may be provided on one active region 115. The two string selection transistors may be a depletion transistor and an enhancement transistor having different threshold voltages from one another. The string selection lines SSL1 and SSL2 (see FIG. 2A) may electrically connect the string selection transistors of two active regions 115. That is, one string selection line SSL1 or SSL2 (see FIG. 2A) may be electrically connected to the depletion transistor and the enhancement transistor in an alternate manner.

When three active regions 115 are electrically connected to one bit line, three string selection transistors may be provided on one active region 115. The three string selection transistors may be a low threshold voltage transistor, a middle threshold voltage transistor, and a high threshold voltage transistor having different threshold voltages from one another. The string selection lines SSL1, SSL2, and SSL3 (see FIG. 2A) may electrically connect the string selection transistors to each other in the three active regions 115. That is, one string selection line SSL1, SSL2, or SSL3 (see FIG. 2A) may be electrically connected to the low threshold voltage transistor, the middle threshold voltage transistor, and the high threshold voltage transistor in an alternate manner.

The string selection transistors having these different threshold voltages from one another may serve as switches to select a specific active region out of the plurality of active regions 115 electrically connected to a single bit line.

The semiconductor device according to an embodiment may include the transistors in which the threshold voltage is adjusted according to the recessed degree of the device isolation layer between the adjacent transistors without performing an ion implantation process. Accordingly, since the threshold voltage of the transistor may be easily adjusted, the semiconductor device having high integration and reliability may be provided. In the above-described embodiment, the manner of adjusting only the threshold voltage of the string selection transistors in the string selection transistor region of the cell region has been described, but the threshold voltage of peripheral circuit transistors in the peripheral circuit region may be adjusted in a similar manner.

The semiconductor device according to an embodiment may include the transistors having different threshold voltages from one another. Accordingly, the plurality of string structures may share only one bit line and the design rule may be improved. Thus, the semiconductor memory device having high integration may be provided.

Figure 6:
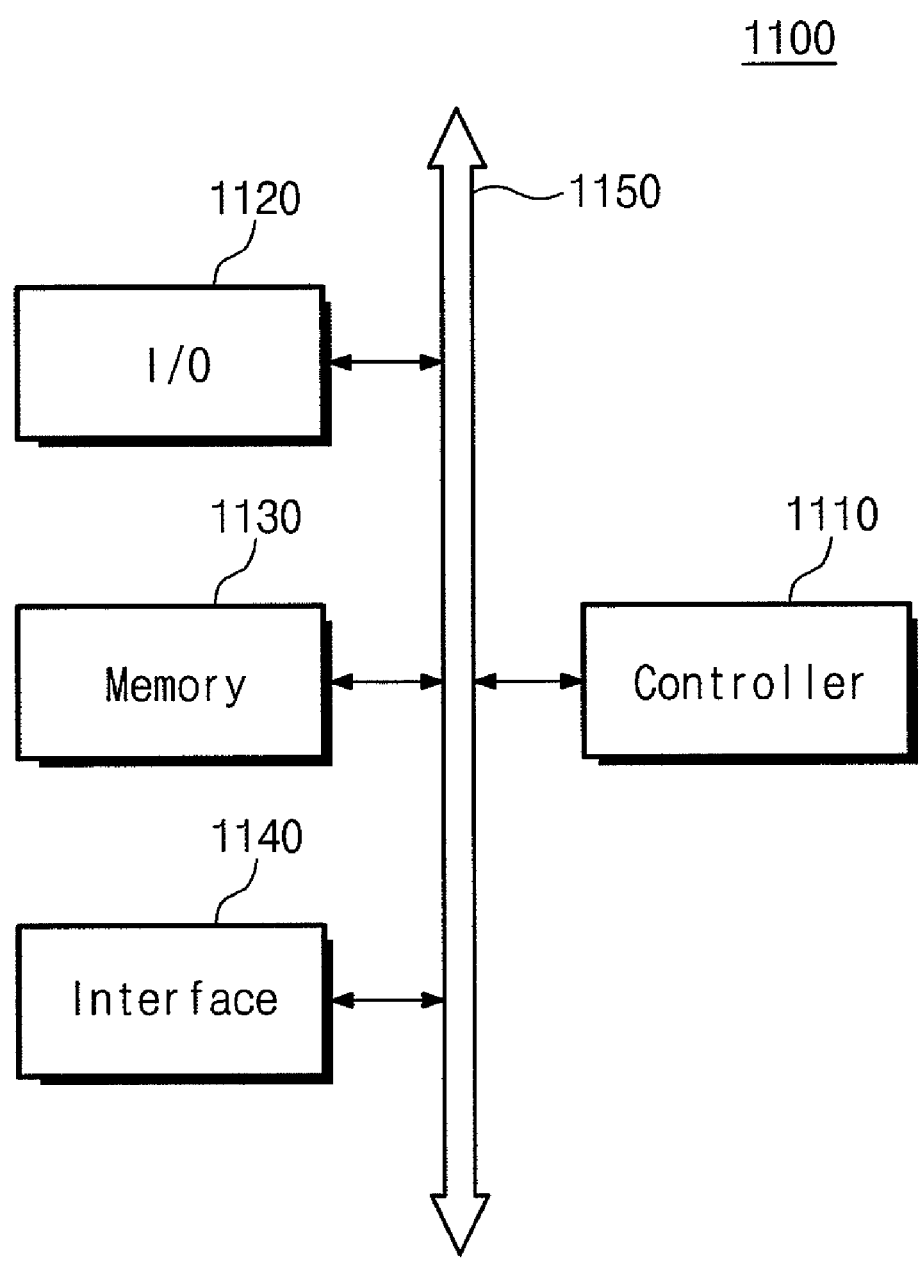
FIG. 6 illustrates a schematic block diagram of an example of a memory system including the nonvolatile memory device according to an embodiment.

FIG. 6 illustrates a schematic block diagram of an example of a memory system including the nonvolatile memory device according an embodiment.

Referring to FIG. 6, a memory system 1100 may be applicable to, e.g., a personal digital assistant (PDA), a portable computer, a web tablet, a wireless phone, a mobile phone, a digital music player, a memory card, or any device capable of transmitting and/or receiving information in a wireless environment.

The memory system 1100 may include, e.g., a controller 1110, an input/output (I/O) device 1120 such as a key pad, a keyboard, or a display device, a memory 1130, an interface 1140, and a bus 1150. The memory 1130 and the interface 1140 may communicate with each other through the bus 1150.

The controller 1110 may include at least one microprocessor, a digital signal processor, a microcontroller, or others process devices similar thereto. The memory 1130 may be used for storing commands executed by the controller 1110. The I/O device 1120 may receive data or signals from the outside of the memory system 1100 or may output data or signals to the outside of the memory system 1100. For example, the I/O device 1120 may include a keyboard, a key pad, or a display device.

The memory 1130 may include the nonvolatile memory device according to an embodiment. The memory 1130 may further include another kind of memory, a volatile memory capable of arbitrarily accessing whenever necessary, and other various kinds of memories.

The interface 1140 may transmit data to a communication network or may receive data form a communication network.

Figure 7:
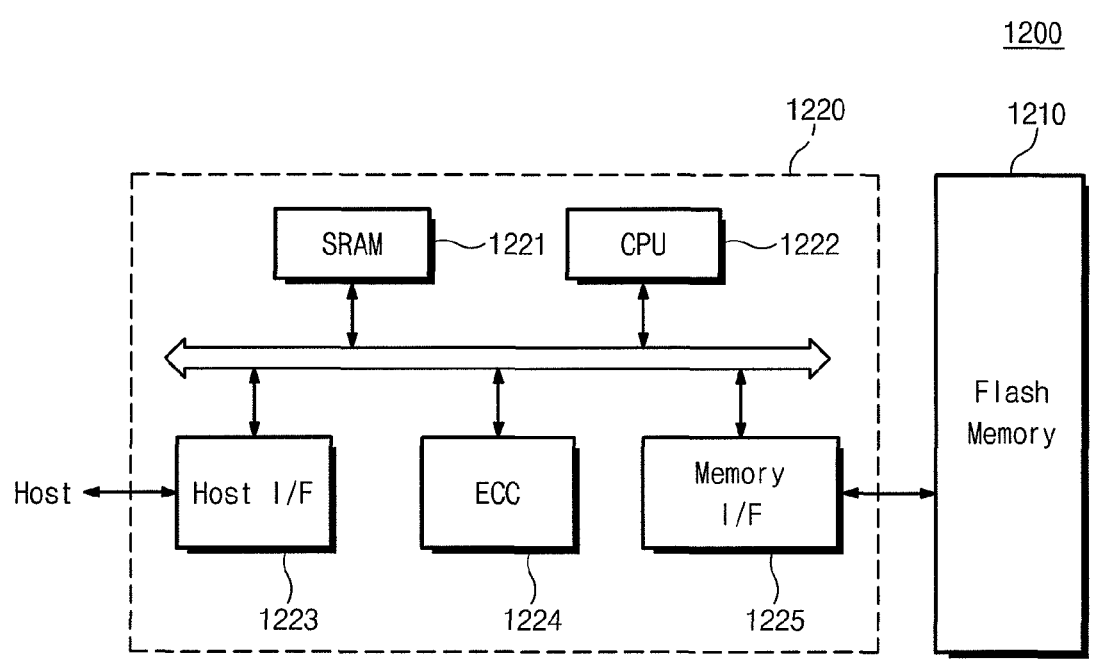
FIG. 7 illustrates a schematic block diagram of an example of a memory card including the nonvolatile memory device according to an embodiment.

FIG. 7 illustrates a schematic block diagram of an example of a memory card including the nonvolatile memory device according to an embodiment.

Referring to FIG. 7, a memory card 1200 may be mounted with a flash memory device 1210 according to an embodiment to support a mass data storing ability. The memory card 1200 may include a memory controller 1220 for controlling all the data exchange between a host and the flash memory device 1210.

A Static Random Access Memory (SRAM) 1221 may be used as an operation memory of a Central Processing Unit (CPU) 1222 which is a processing unit. A host interface (I/F) 1223 may have a data exchange protocol of a host connected to the memory card 1200. An Error Correction Coding block (ECC block) 1224 may detect and correct errors of data read from the flash memory device 1210 with a multi-bit characteristic. A memory interface (I/F) 1225 may interface with the flash memory device 1210. The CPU 1222 may control overall operations for the data exchange of the memory controller 1220. Even though not illustrated in the drawings, it will be apparent to those skilled in the art that the memory card 1200 may further be provided with a ROM (Read-Only Memory, which is not shown) storing code data for interfacing with the host.

According to the flash memory device, the memory card, or the memory system, there is provided the memory system which is highly integrated by the flash memory device in which the plurality of string structures share one bit line. In particular, the flash memory device according to an embodiment may be provided in the memory system such as a solid state drive (SSD), which has actively been developed in recent. In this case, a highly integrated memory system may be realized such that the plurality of string structures in the flash memory device share one bit line.

Figure 8:
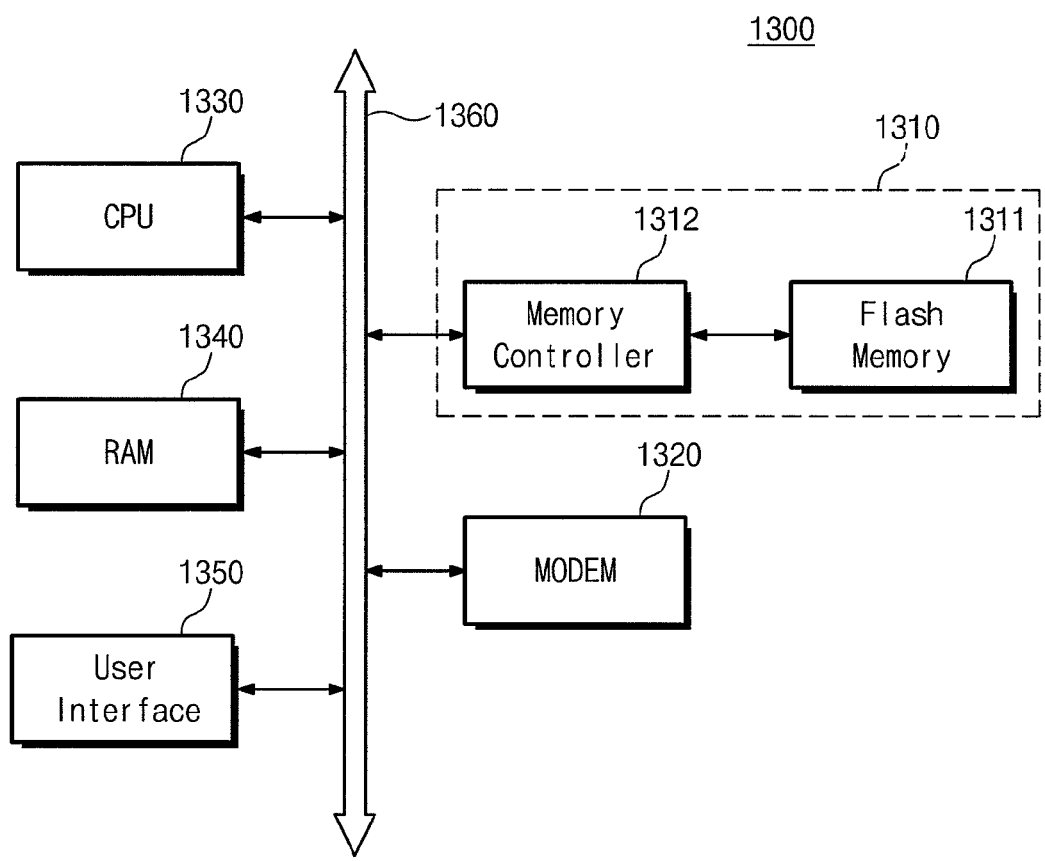
FIG. 8 illustrates a schematic block diagram of an example of an information processing system mounting the nonvolatile memory device according to an embodiment.

FIG. 8 illustrates a schematic block diagram of an example of an information processing system mounting the nonvolatile memory device according to an embodiment.

Referring to FIG. 8, a flash memory system 1310 may be mounted into an information processing system such as a mobile device or a desktop computer. An information processing system 1300 may include a flash memory system 1310, a MOdulator and DEModulator (MODEM) 1320, a central processing unit 1330, a RAM 1340, and a user interface 1350, which are electrically connected to a system bus 1360, respectively. The flash memory system 1310 may have substantially the same configuration as the above-described memory system or flash memory system. The flash memory system 1310 may store data processed by the central processing unit 1330 or data input from the outside. Here, the above-described flash memory system 1310 may be configured as a solid state drive. In this case, the information processing system 1300 may stably stores mass data in the flash memory system 1310. Moreover, as the reliability increases, the flash memory system 1310 may reduce resources required for error correction, thereby providing a high-speed data exchange function to the information processing system 1300. Even though not illustrated in drawings, it will be apparent to those skilled in the art that an application chipset, a camera Image Signal Processor (ISP), an input/output device, or the like may further be provided to the information processing system 1300 according to an embodiment.

The flash memory device or the memory system according to an embodiment may be mounted in various types of packages. For example, the flash memory device or the memory system may be packaged and mounted in such manners as Package on Package (PoP), Ball Grid Array (BGAs), Chip Scale Packages (CSPs), Plastic Leaded Chip Carrier (PLCC), Plastic Dual In-line Package (PDIP), Die in Waffle Pack, Die in Wafer Form, Chip On Board (COB), Ceramic Dual In-Line Package (CERDIP), Plastic Metric Quad Flat Pack (MQFP), Thin Quad Flat Pack (TQFP), Small-Outline Integrated Circuit (SOIC), Shrink Small-Outline Package (SSOP), Thin Small-Outline Package (TSOP), Thin Quad Flat Pack (TQFP), System In Package (SIP), Multi Chip Package (MCP), Wafer-level Fabricated Package (WFP), or Wafer-level processed Stack Package (WSP).

As described above, according to an embodiment, the threshold voltages of the transistors may be adjusted according to the recessed degree of the device isolation layer between the adjacent transistors without performing an ion implantation process. Accordingly, the threshold voltage of the transistor may be easily adjusted, thereby increasing the integration and reliability of the semiconductor memory device.

Furthermore, according to an embodiment, since the transistors having different threshold voltages are provided, the plurality of string structures may share one bit line. Accordingly, a design rule may be improved, thereby increasing the integration of the semiconductor memory device.

Exemplary embodiments have been disclosed herein, and although specific terms are employed, they are used and are to be interpreted in a generic and descriptive sense only and not for purpose of limitation. Accordingly, it will be understood by those of ordinary skill in the art that various changes in form and details may be made without departing from the spirit and scope of the present invention as set forth in the following claims.

What is claimed is:

1. A semiconductor memory device, comprising:
    string structures, the string structures including two or more adjacent string selection transistors connected in series to each other in a first direction and being spaced apart from one another in a second direction intersecting the first direction, the two or more string selection transistors having different threshold voltages;
    string selection lines, the string selection lines connecting the adjacent string selection transistors of the string structures in the second direction; and
    a bit line electrically connecting two or more adjacent string structures,
    wherein:
        a device isolation layer between the adjacent string selection transistors in the second direction has recessed regions, and
        profiles of the recessed regions on respective sides of the string selection transistors are different from each other.

2. The semiconductor memory device as claimed in claim 1, wherein the string structures include memory transistors connected in series to the string selection transistors in the first direction.

3. The semiconductor memory device as claimed in claim 2, wherein the string structures further include a ground selection transistor connected in series to one side of the memory transistors facing the string selection transistors.

4. The semiconductor memory device as claimed in claim 3, wherein the bit line is electrically connected to the one side of the string selection transistors facing the memory transistors.

5. The semiconductor memory device as claimed in claim 1, wherein the string selection transistors each include a sequentially stacked charge storage pattern and gate electrode such that a plurality of the string selection transistors entail a plurality of charge storage patterns and gate electrodes.

6. The semiconductor memory device as claimed in claim 5, wherein the recessed regions are between the charge storage patterns of the string selection transistors.

7. The semiconductor memory device as claimed in claim 6, wherein the recessed regions expose at least a portion of sidewalls of the charge storage patterns.

8. The semiconductor memory device as claimed in claim 1, wherein depths of the recessed regions on respective sides of the string selection transistors are different from each other.

9. The semiconductor memory device as claimed in claim 1, wherein the recessed regions have a profile in which a width thereof narrows toward a lower portion thereof.

10. The semiconductor memory device as claimed in claim 1, wherein one of the string selection transistors associated with one of the recessed regions has a threshold voltage higher than a string selection transistor associated with another of the recessed regions having a deeper depth.

11. A semiconductor device, comprising:
    device isolation layers defining active regions on a substrate; and
    transistors on the active regions,
    wherein:
        the device isolation layers have recessed regions,
        profiles of the recessed regions on respective sides of the transistors are different from each other, and
        the transistors have different threshold voltages from one another.

12. The semiconductor device as claimed in claim 11, wherein the threshold voltages of the transistors are inversely proportional to recessed depths of the recessed regions.

* * * * *